(12) United States Patent
Daw

(10) Patent No.: US 6,348,798 B1
(45) Date of Patent: Feb. 19, 2002

(54) ANALOG TO DIGITAL VOLTAGE MEASURING DEVICE

(75) Inventor: Bradley M. Daw, Orem, UT (US)

(73) Assignee: Alpha Smart, Inc., Cupertino, CA (US)

( * ) Notice: Subject to any disclaimer, the term of this patent is extended or adjusted under 35 U.S.C. 154(b) by 0 days.

(21) Appl. No.: 09/730,620

(22) Filed: Dec. 5, 2000

(51) Int. Cl.[7] .......................................... G01N 27/416
(52) U.S. Cl. ...................................... 324/426; 324/425
(58) Field of Search ................................ 324/426, 428, 324/433, 425; 320/137, 149, 152, 157

(56) References Cited

U.S. PATENT DOCUMENTS

| | | | |
|---|---|---|---|
| 3,999,123 A | | 12/1976 | Thoener ..................... 324/132 |
| 4,071,822 A | | 1/1978 | Kamiya ...................... 324/426 |
| 5,099,209 A | * | 3/1992 | Seki et al. .................. 324/428 |
| 6,118,295 A | * | 9/2000 | Murayama et al. ......... 324/433 |
| 6,118,680 A | * | 9/2000 | Wallace et al. .............. 363/71 |

* cited by examiner

Primary Examiner—Peter S. Wong
Assistant Examiner—Lawrence Luk
(74) Attorney, Agent, or Firm—Thorpe North & Western, LLP

(57) ABSTRACT

A voltage measuring circuit for measuring a voltage level of an unknown voltage source, including a capacitor configured for storing a charge from the unknown voltage source, a switch such as a transistor, configured to discharge the capacitor after the capacitor has reached a known threshold voltage, a microprocessor which controls the switch and measures the amount of time required to charge the capacitor to the threshold voltage, allowing the voltage level to be measured without disconnecting the capacitor from the circuit.

27 Claims, 5 Drawing Sheets

ANALOG TO DIGITAL VOLTAGE MEASURING DEVICE

TECHNICAL FIELD

The present invention relates generally to measuring the voltage level of, and characterizing, an unknown voltage source. More particularly, the present invention relates to measuring the voltage of an unknown voltage source, particularly a battery, in an electronic device. This enables characterization as to battery life remaining, or in the cases of other kinds of power supplies, monitoring them and characterizing them as to whether they are within operational parameters.

BACKGROUND

Many electronic devices use a portable DC power supply, most of which use battery power. Such electronic devices can use chemical batteries, including rechargeable batteries, or other known types. In many such devices, it is important to be able to measure the potential or instantaneous voltage, i.e. the "level" of the battery. Being able to measure the battery level enables a user to have a rough prediction of remaining battery life. As will be appreciated, this is because the potential decreases in a known way as a battery of a particular type slowly discharges in normal use.

Knowing the battery level is especially important in certain devices because data can be lost if the device shuts down unexpectedly. For example, in a laptop computer application, a user typically desires to know the battery life remaining at all times. When the battery voltage drops below a certain level, the volatile memory in the laptop computer will be erased, and/or the laptop will shut off. This is also true with respect to wireless instruments such as cellular telephones. It is desirable for the user to know the approximate length of the remaining battery life because it is frustrating to have a conversation terminated abruptly due to an expended battery. If users of such electronic devices have an accurate measurement of battery level, and thereby a characterization of the battery such as a prediction of the battery life remaining, they are less likely to be subjected to data loss or communication interruptions, assuming rational user behavior.

There are a number of voltage level measuring devices known in the relevant art. These devices typically can have one or both of two drawbacks; namely, that they tend to have a low level of accuracy, or that they are expensive to build. In the competitive electronics marketplace, it is likely quite valuable to provide a low-cost, accurate voltage measuring device. However, in the past the design goals of accuracy and low cost have appeared to be mutually exclusive. For example, known voltage measuring devices having increased accuracy generally are more complex compared with less accurate devices; and typically require several relatively expensive components. These factors increase the cost. Examples of devices which measure unknown voltage levels from a power source are disclosed in U.S. Pat. No. 4,071,822 to Kamiya, and U.S. Pat. No. 3,999,123 to Thoener.

SUMMARY

It has been recognized that it would be advantageous to provide a device which uses inexpensive electronic components and a straight-forward method to characterize an unknown voltage source, e.g. to determine battery voltage in an electronic device. In a more detailed aspect, it is also desirable to provide a system which would allow accurate measurement of an unknown voltage source without disconnecting a test capacitor from the circuit. In a further more detailed aspect, it has been recognized that it would be advantageous to develop a system which minimizes the use of relatively expensive electronic components, such as A/D converters to measure the voltage output of an unknown voltage source such as a battery.

In accordance with one aspect of the present invention, the system includes a voltage measuring circuit comprising a capacitor configured for storing a charge from the unknown voltage source. The capacitor is charged through a resistor. A switch, which can be a solid-state device such as a transistor, is configured in parallel to discharge the capacitor at a time after the capacitor has reached a threshold voltage. A microprocessor controls the switch and measures the amount of time required to charge the capacitor to the threshold voltage. The time required to charge the capacitor to the threshold potential is used to determine the voltage level of the unknown voltage source. In accordance with another aspect of the present invention, the system can include a voltage comparator coupled to the microprocessor to signal the instant in time when the threshold voltage is reached.

Another aspect of this invention is a method for measuring the voltage level of an unknown voltage source. One step of the method is charging a previously discharged capacitor, beginning at a known instant of time, from the unknown voltage source. Another step of the method is monitoring the amount of time needed to charge the capacitor from a discharged state to a threshold voltage level without disconnecting the capacitor from the unknown voltage source. In another step, the capacitor voltage is discharged using a switch electrically coupled in parallel after the capacitor voltage has reached the threshold value. The method also includes the step of determining the unknown voltage based on the length of time required to charge the capacitor from a fully discharged state to the threshold voltage level.

Additional features and advantages of the invention will be appreciated with reference to the following detailed description, which, taken in conjunction with the accompanying drawings, illustrate, by way of example, features and advantages of the invention.

BRIEF DESCRIPTION OF THE DRAWINGS

The same reference numbers are used to refer to similar elements in the various embodiments shown in the several drawing figures.

DETAILED DESCRIPTION

For purposes of promoting an understanding of the principles of the invention, reference will now be made to exemplary embodiments illustrated in the accompanying drawings, and specific language will be used to describe the same. It will nevertheless be understood that no limitation of the scope of the invention is thereby intended.

Figure 1:
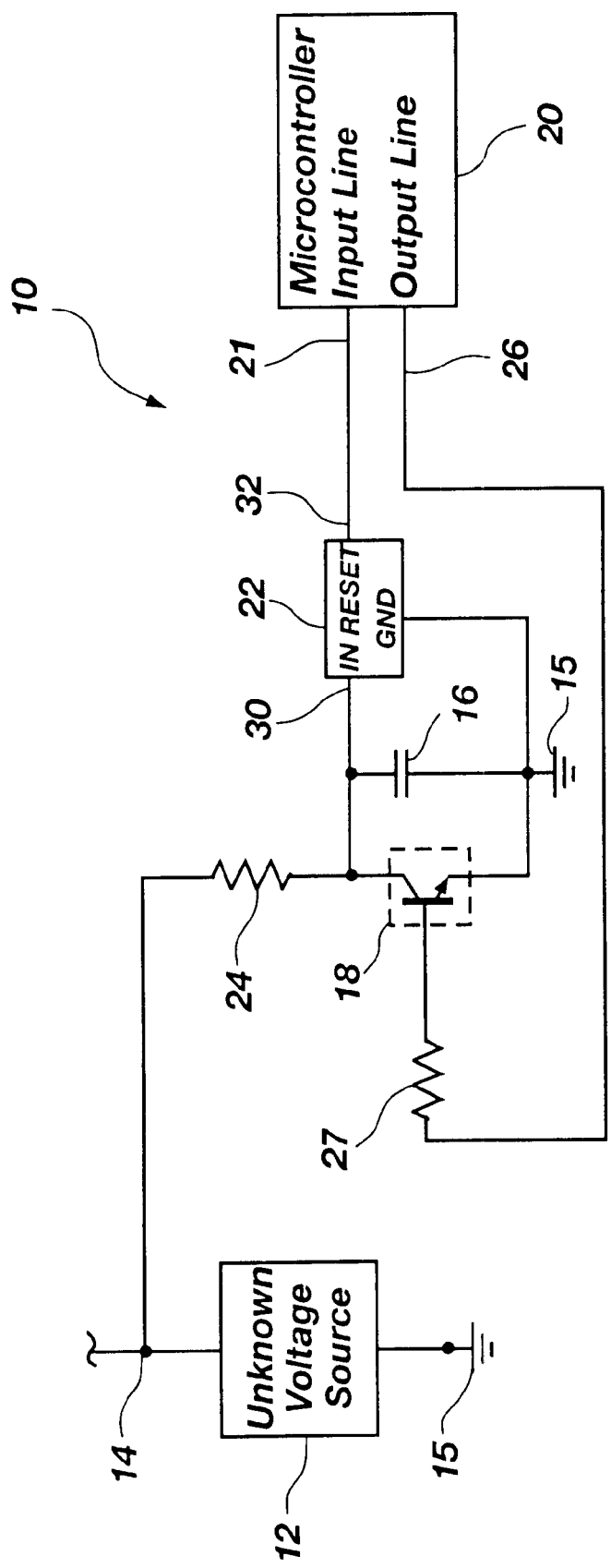
FIG. 1 is a schematic illustration of an exemplary embodiment of a voltage measuring circuit in accordance with principles of the invention.

As illustrated in FIG. 1, a voltage measuring circuit 10 comprising an exemplary embodiment of principles of the invention is configured for measuring a voltage level of an unknown voltage source 12 at a test point 14. In the illustrated embodiment, the measuring circuit is connected so as to allow the circuit to measure the voltage level with reference to ground 15. The unknown voltage source can be a chemical cell, for instance a rechargeable battery, or another voltage source, which has an unknown voltage value. The unknown voltage source can also be a varying voltage signal, and low frequency analog signals up to a frequency in the 20–30 Hz range can be analyzed, as will be discussed below. The circuit further comprises a capacitor 16 configured for storing a charge from the unknown voltage source. The capacitor is charged to a threshold voltage by the unknown voltage source through a resistor 24 connected in series. As will be appreciated, the time that it takes to charge the capacitor to the threshold value varies with the voltage. Since voltage is related to the remaining charge in the battery, a measure of the time to charge the capacitor can be used to characterize the battery as to charge remaining. It will also be appreciated that the capacitor can be allowed to continue to charge beyond the threshold potential value up to a maximum value, given the particular capacitor used and the particular voltage of the unknown voltage source. The capacitor can remain at that voltage, and no current is drawn through the resistor 24, until the capacitor 16 is discharged and a new capacitor charging and voltage measuring cycle is initiated.

As mentioned, a switch 18 is electrically connected in parallel to discharge the capacitor. The switch 18 is a transistor in the illustrated embodiment. When the capacitor is discharged, which occurs at some time after the capacitor has reached the threshold voltage, sufficient time is allowed for the capacitor to discharge completely. This discharge of the capacitor can be immediately after passing the threshold voltage; or the capacitor can be allowed to approach the maximum voltage, and considerable delay be allowed before initiating another sampling cycle. As will be appreciated from the following discussion, voltage of the unknown voltage source 12 is sampled in each charge/discharge cycle of the capacitor in the illustrated embodiment.

Using a transistor as the switch 18 described herein is a low-cost solution, and therefore advantageous. Other types of switching devices, such as relays, MOSFETs, and I/Cs having bi-directional I/O pins, can be used in alternative embodiments.

A microcontroller 20 is included in the circuit 10, and is configured to control the switch 18 and measure the amount of time required to charge the capacitor 16 to the threshold voltage. The microcontroller typically has other functions in an electronic device in which it is used, but in accordance with the invention in relevant aspects it interacts with the other elements of the circuit 10 through an input line 21 and an output line 26. The microcontroller typically includes a clock, and memory, and a processor to accomplish the control functions required of it in this illustrated embodiment. As an example, a Motorola MC68HCO5 microcontroller can be used; and it will be appreciated by those skilled in the art that another one of many integrated microprocessor devices, widely commercially available, can be used.

The measured time required to charge the capacitor 16 to the threshold voltage is used by the microcontroller 20 to determine the voltage level of the unknown voltage source 12. The circuit 10 also includes a reset controller 22, which provides a state-change logic signal to the microcontroller at the instant of time that the threshold voltage is reached in charging the capacitor. As an example, a Motorola MC33464H-27AT1 reset controller can be used; and it will further be appreciated that another one of the many such commercially-available reset controllers can be substituted. When the voltage at an input pin 30 of the reset controller is less than the selected threshold voltage, the reset pin 32 of the resent controller is a first state, for example a low voltage representing a positive logic 0. When the voltage at the input pin rises to and reaches the threshold voltage, the output at the reset pin changes to a second state, for example a higher voltage corresponding to a positive logic 1. This state change comprises a signal to the microcontroller, which uses the signal to know when to stop timing of the charging of the capacitor to the threshold voltage value. After this signal is received by the microcontroller, depending on programming, the microcontroller can allow the capacitor to continue to charge to a maximum value, and continue to wait for the next sampling cycle, or can immediately begin a new sampling cycle, for example by bringing an output line 26 of the Microcontroller from a low to a high voltage signal state to enable the transistor comprising the switch 18. This in effect allows a shunt current path through the switch and discharges the capacitor 16.

When the capacitor 16 discharges, the reset controller 22 will change state, as the voltage at the input line 30 drops past the threshold value. Sufficient time for the capacitor to completely discharge is then given by the microcontroller 20. Then the output line 26 of the microcontroller is brought to a low voltage signal value, which in effect opens the switch 18. Current cannot flow through the transistor as the base voltage goes low, and this allows the capacitor to charge again for the next sample cycle. Simultaneously with bringing the voltage signal on output line 26 low to open the switch, timing is initiated by the microcontroller for the next cycle. A second resistor 27 is used to match the output of the microcontroller output line 26 to the base voltage range of the transistor comprising the switch 18.

In one embodiment, many of the circuit elements described herein in connection with this embodiment and other embodiments described below can be integrated onto a single chip, and LSI or VLSI processes can be used to form the switch 18 using FET, MOSFET, or other integrated circuit switch methodologies. Many of the other elements of the circuit described herein can be incorporated in an integrated circuit form, as known to those skilled in the art.

Figure 2:
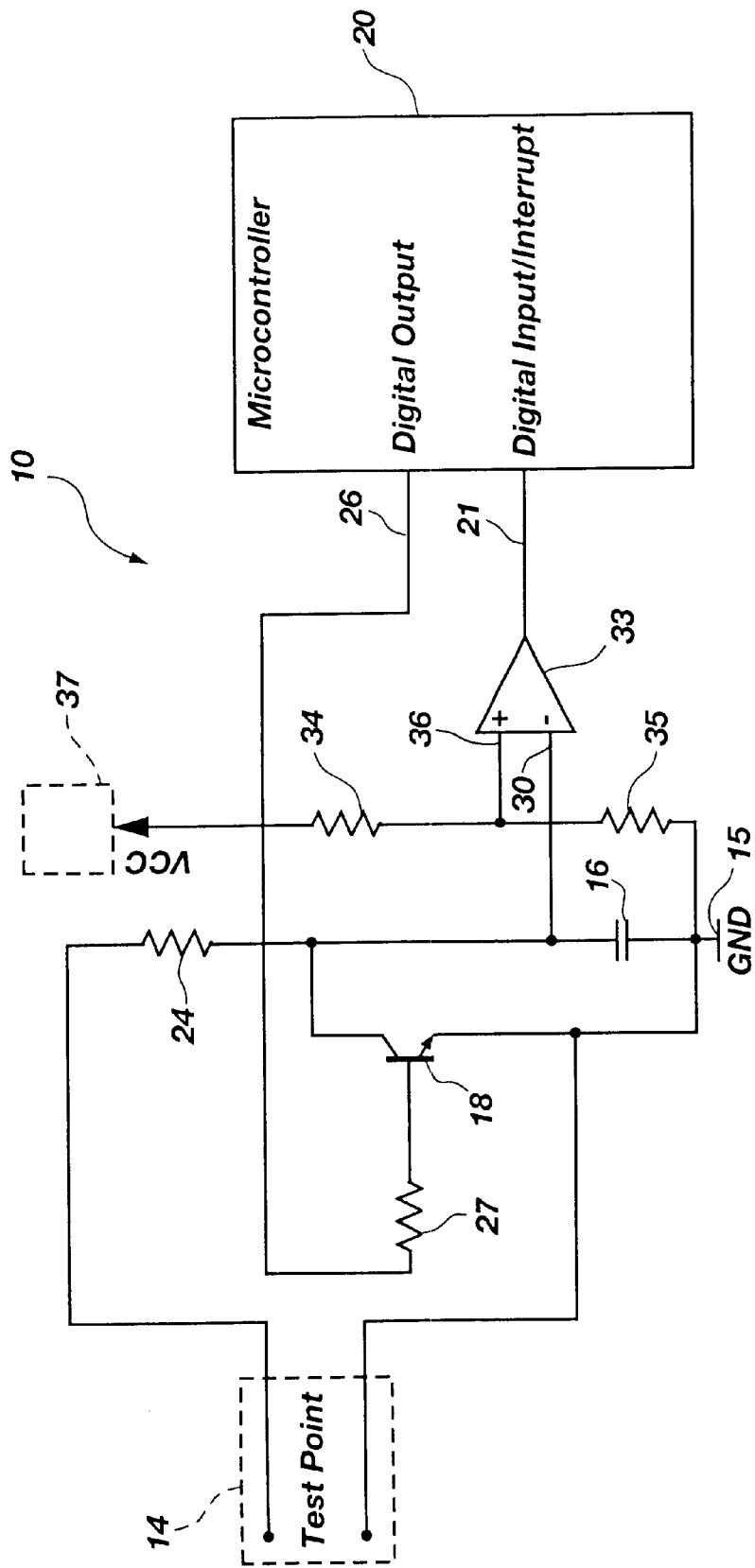
FIG. 2 is schematic illustration of a voltage measuring circuit in another exemplary embodiment.

Turning now to FIG. 2, a circuit 10 in accordance with principles of the invention in another embodiment comprises a comparator 33 and a pair of resistors 34, 35 rather than the reset controller (22 in FIG. 1) previously described. In this embodiment, a selected reference voltage comprising the threshold voltage ($V_t$), is applied at one input line 36 of the comparator, and this voltage is a fractional value of the supply voltage ($V_{cc}$) for the comparator from a power supply 37. The threshold voltage on the input line 36 is given by appropriate selection of the values for the two resistors 34, 35 bracketing the connection of the reference voltage supply line 36 on a line from the power supply 37 to ground 15. Voltage from the capacitor 16 comes in to the comparator 33 on a second line 30 (the inverted input) in the illustrated embodiment.

Figure 3:
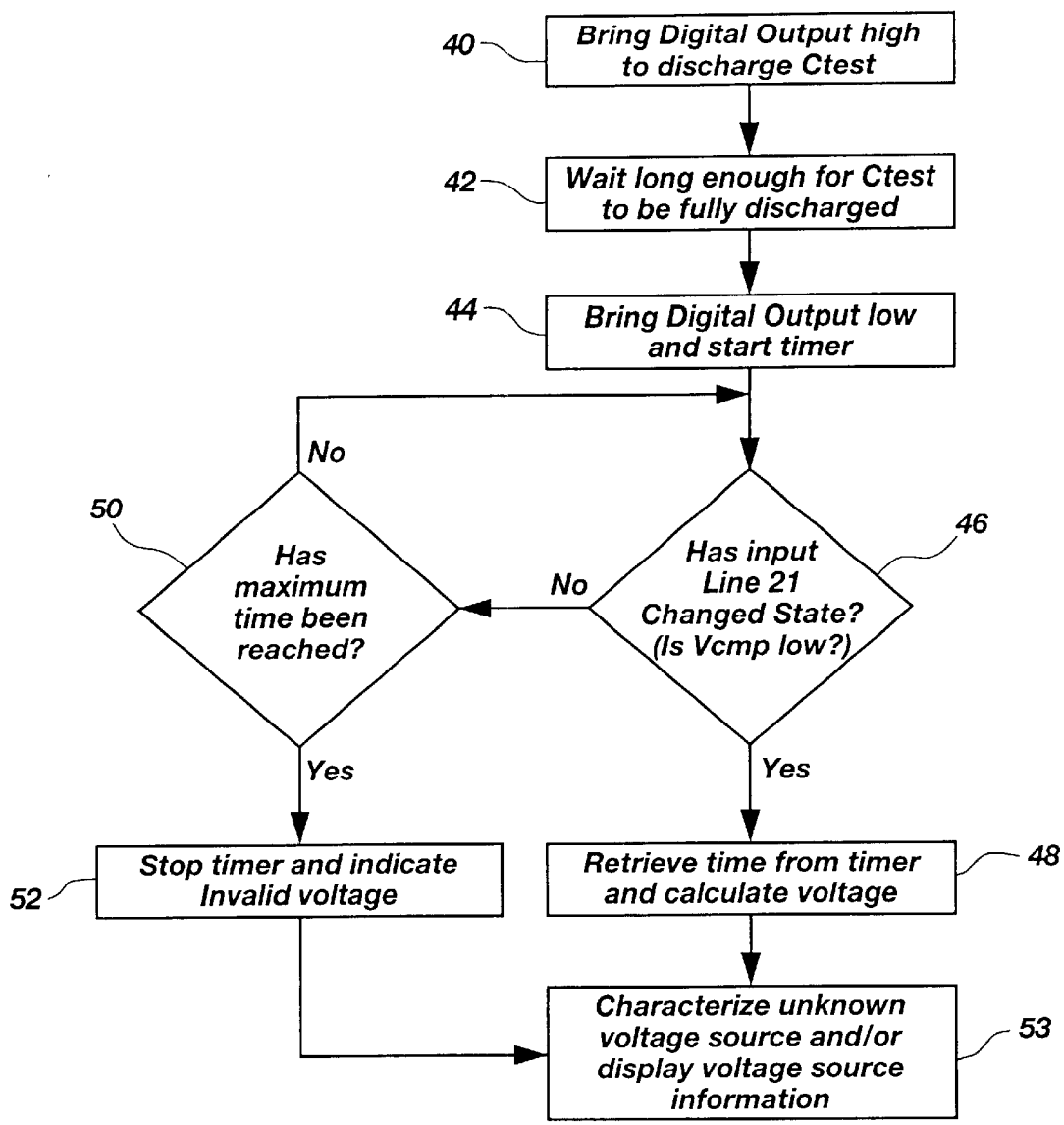
FIG. 3 is a flowchart illustrating steps of a method for measuring the voltage of an unknown voltage source in one embodiment.

With reference to FIGS. 2 and 3, a method for measuring the voltage from the test point 14 in this embodiment will now be discussed. In a first step 40, the microcontroller 20 brings the digital output line 26 from low to high. This causes the switch 18 (transistor) to go to saturation (turns the switch "on") and enables the compacitor 16 to discharge. In the next step 42, the microcontroller waits a selected period of time sufficient for the capacitor to fully discharge. This period of time depends on the capacitor selected, and the amount of time to wait is programmed into the microcontroller. After the capacitor discharges, the voltage at the inverted input line 30 of the comparator 33 is low. In the next step 44, the digital output line 26 of the microcontroller is brought to a low voltage by the microcontroller, turning "off", or opening, the switch 18, so that no current can flow therethrough. Simultaneously, timing is started by the microcontroller. With the switch 18 thus opened, the capacitor is charged from the unknown voltage source at the test point 14 through the resistor 24 as is done in the embodiment described above. The voltage of the capacitor 16 is compared to the threshold voltage on the non-inverted input line 36 by the comparator 33. At step 46, the digital input 21 is checked to see if a state change from high to low has occurred. As will be appreciated, the output of the comparator on line 21 is a high logic signal as long as the voltage on line 30 from the capacitor is below the threshold voltage at line 36. When the voltage on the capacitor passes the threshold voltage the comparator indicates a state change to a logical low signal on line 21, the input to the microcontroller 20. In another embodiment the state change could be made to go from low to high to indicate that the threshold voltage has been reached, depending on the comparator selected, typically for compatibility with the microcontroller selected. Step 46 is a branching step, and if it is found that the logic signal on line 21, the digital input, has gone from high to low, then the step branches to step 48 where timing of the charging of the capacitor 16 from fully discharged to the threshold voltage is stopped, and the time is retrieved and the voltage of the unknown voltage source at the test point 14 is determined based thereon. Using the length of time measured, the voltage can be determined by the following formula:

$$V = V_t/(1 - e^{(-t/R_1C_1)})$$

wherein

V is the voltage of the unknown voltage source 12;

$V_t$ is the voltage of the capacitor 16 at time t, i.e. the threshold voltage (or reference voltage);

e is the natural logarithmic base number;

t is the time in seconds taken to charge the capacitor from fully discharged to the threshold voltage;

$R_1$ is the value in ohms of the resistor 24 used; and $C_1$ is the value in farads of the capacitor 16 used.

Figure 4:
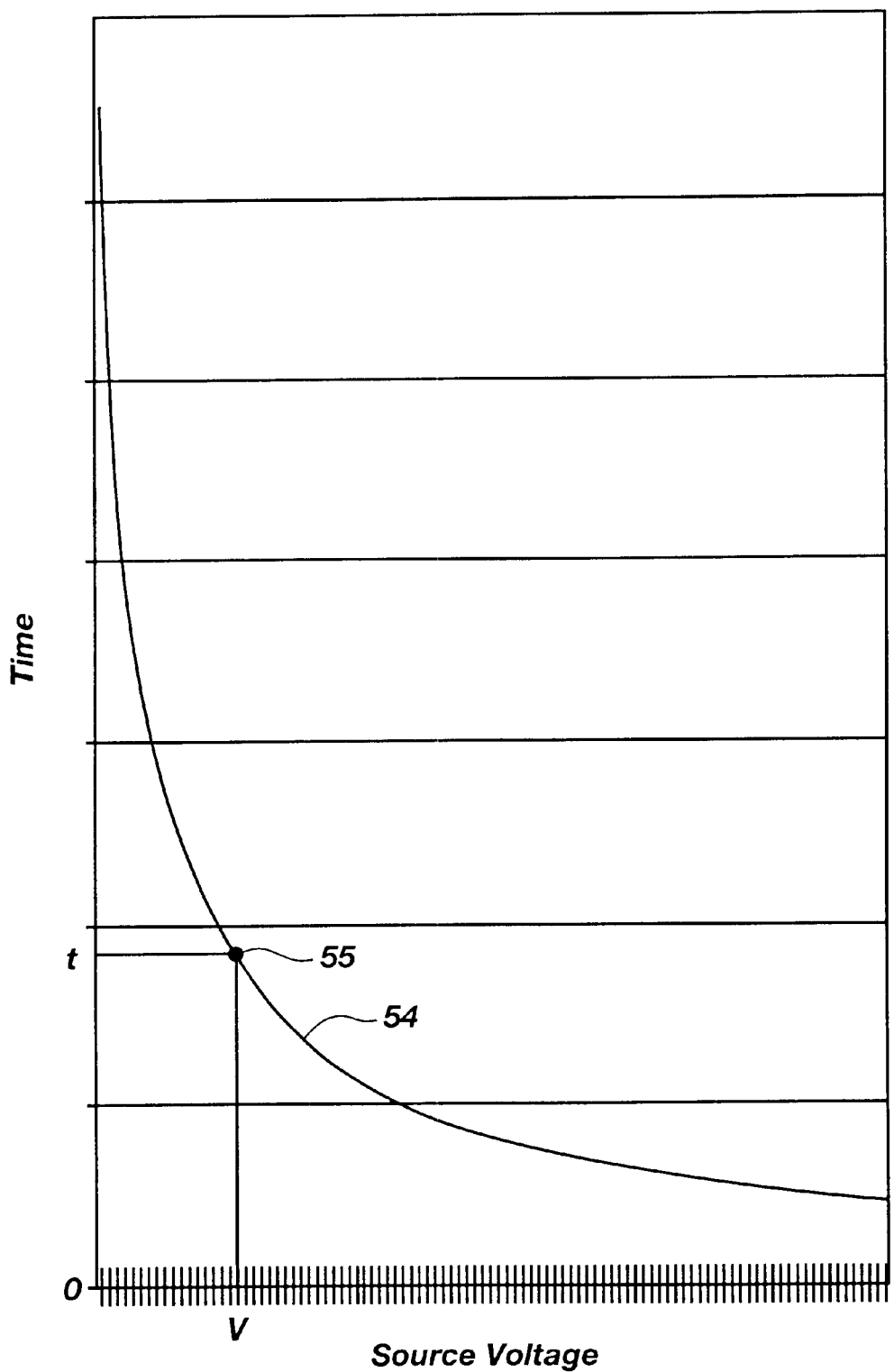
FIG. 4 is a graph representing a plot of the time required to charge an exemplary capacitor to a threshold value based on the provided source voltage.

It is important to note that the longer it takes to charge the capacitor 16, the lower the voltage of the unknown voltage source at the test point 14. With reference to FIG. 4, the graph shows a logarithmic curve 54 comprising a plot of the time it takes to charge the capacitor to a particular voltage, charging from a source voltage. As the voltage of the unknown source decreases, the time to charge the capacitor increases, based on the equation given above.

It is much too time consuming to calculate the solution to this equation in real time. Thus, prior devices, mentioned above, utilize the approach of linearizing the capacitor discharge. Those devices include provisions to disconnect the capacitor from the voltage source in carrying out the prior method. In contrast, in one embodiment of the invention a device can be made to take advantage of time savings realized by calculating solutions to the equation in advance and storing them in a look-up table in the memory of the microcontroller 20. This table allows the voltage of the unknown source 12 to be determined using simple timing and indexing steps. An interpolation algorithm can be used if more accuracy is needed. In the above-described embodiment, the accuracy of the logarithmic curve calculated beforehand and stored in the look-up table is combined with the speed of simply timing the charging of the capacitor to the voltage threshold and getting the indexed V value back from the table, which gives very fast and accurate results for the unknown voltage value as will be further described below.

Returning to FIGS. 2 and 3, if the logic signal from the voltage comparator 33 is high, and not low (the state change has not occurred), then at branching step 46 the algorithm branches to step 50, a further branching step. At step 50, the microcontroller checks to see if a maximum time-out has been reached. If the time-out has not been reached, then a branch back to testing step 46 is followed, and the sequence repeats. If the time-out is reached and the capacitor has not been charged to the threshold voltage (input line 21 is at logic 1, or high, and not low), then step 50 branches to step 52 and microprocessor timing of capacitor charging is stopped and an invalid voltage condition is displayed to the user. The invalid voltage is displayed using a display component (not shown). It will be appreciated that unknown voltages V below the threshold voltage $V_t$, cannot be measured without manipulation requiring additional components and attendant additional cost.

After determining the voltage of step 48, or determining that an invalid voltage has been detected at a step 52, at step 53 a signal is sent to the user using a display component as mentioned. The display component can be a "low battery" light, or a voltage gauge, or an indicia conveying information about battery level or otherwise characterizing the voltage source on a CRT, LCD, or other display. The salient feature of the display can be that it indicates that the battery needs to be replaced, or another voltage source should be used in the case of an invalid voltage; or that it gives some indication of battery life in an embodiment where the unknown voltage source is a battery being monitored. A symbolic representation such as a bar graph within a battery indicative of battery condition is known in the art, and can be provided based on the voltage detected. In one embodiment, the voltage detected can be accounted for by updating stored data, and can comprise a number stored in a register in the microcontroller and the status of the display indicia is based on that number. In another embodiment, the display to the user can further comprise an indication when the voltage value is dangerously low, indicating that the battery level is critical and only a short period of battery life remains. Depending on the type of battery used, a particular voltage value can be used to trigger such an indication, comprising a flashing of the bar graph, an additional icon appearing, or other notification of the user on the display component, an audible signal, etc.

Returning to discussion of calculation of the voltage based on the timing of charging at step 48 discussed above, in an embodiment where the computation of voltage V based on the equation set forth above is accomplished using the pre-computed look-up table stored in the memory of the microcontroller, at least two major advantages are provided. First, as mentioned, indexing into a look-up table is much faster than actually calculating the value of logarithmic charging curve for the measured time value. As mentioned, prior methodologies avoided calculating values of this curve, by means mentioned above, to increase speed.

Second, using this method a means for an accurate factory calibration is provided. The accuracy of the voltage measurement V for the unknown voltage source 12 depends on such things as the accuracy of the timer of the microcontroller 20, the precision of the charging resistor 24 and capacitor 16, and on the amount of leakage current through the switch 18 and the voltage comparator 33. Capacitors and resistors have certain manufacturing tolerances, as is well known, and these variations can be accounted for in this device. For example, if an inexpensive capacitor has a certain capacitance rating, the actual capacitance value can be plus/minus twenty percent due to manufacturing tolerances. This variance can effect the final voltage measurements. Using a lookup table allows the system 10 to be calibrated initially with a reference DC power source (not shown) which has a known voltage value. The circuit charges the capacitor 16 and measures the time required to charge the capacitor based on the known voltage. With reference to FIG. 4 in addition to FIGS. 2 and 3, the known voltage, V and measured time, t, gives a point 55 on the curve 54, and other values of the function are calculated based on this information. To obtain a two point calibration for additional accuracy, two measurements are performed using two different known voltages; likewise a three point calibrum using three known voltages can be performed. Actual measured value(s) for t, from the calibration are used in developing the other pre-calculated curve values stored in the lookup table. This calibration/lookup table programming can be performed at the factory as a production step in manufacture of the device (not shown) wherein the circuit 10 is used. As will be appreciated, this calibration is performed on each device, as the values of the various elements of the circuit 10 will be unique, and therefore the entries in the lookup table will be unique for each device. In this way, accuracy is achieved without compromising speed, and the system still enables low-cost components to be used.

In one embodiment, the components used in the circuit illustrated in FIG. 2 and set forth above are as set forth in the following Table 1:

TABLE 1

| Reference No. | Element Description |
| --- | --- |
| 16 | Capacitor (test) 0.1 $\mu$F |
| 18 | Transistor, 2N3904LP |
| 20 | Microcontroller, MC68HC05 (MOTOROLA) |
| 24 | Resistor (test), 100K |
| 27 | Resistor, 100K |
| 33 | Comparator, LMV393 (Texas Instruments) |
| 34 | Resistor, 100K |
| 35 | Resistor, 100K |

It will be appreciated by those skilled in the art that numerous variations can be made, including substitution of elements, reversing polarities, etc. and that the foregoing Table 1 sets forth one example of implementation for the purpose of illustration of principles of the invention.

Figure 5:
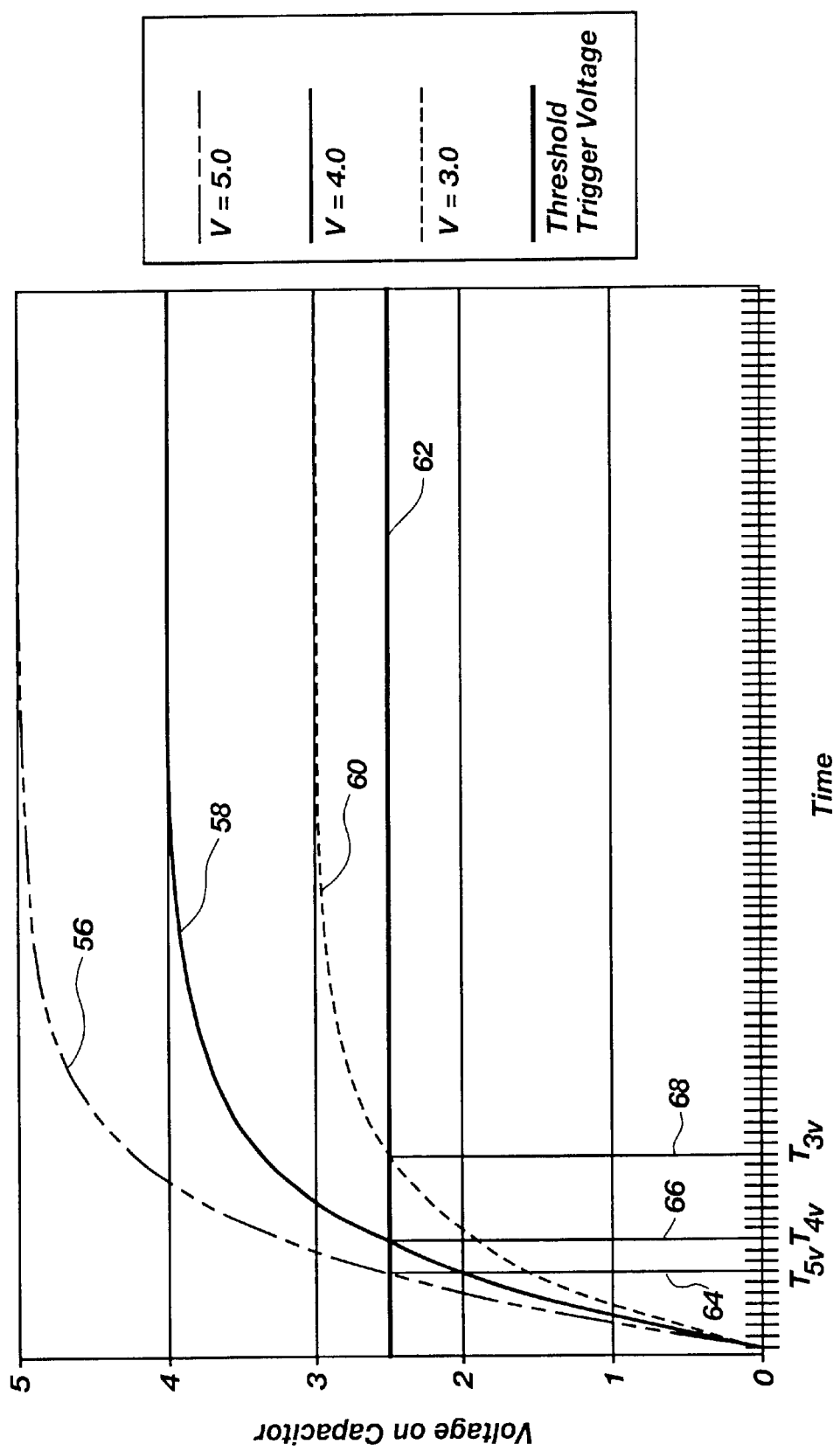
FIG. 5 is a graph illustrating time/charging curves for an exemplary capacitor when the charging voltage is 3, 4, and 5 volts.

With reference to FIG. 5, the above-described principles of operation of the device are illustrated. Plots 56, 58, 60 of voltage on the capacitor 16 versus time are given for voltage sources at the testpoint 14 of 5, 4, and 3 volts, respectively, are shown. A threshold voltage of 2.5 volts is used. Depending on the voltage of the source, the capacitor will charge at a different rate as explained. It can be seen that each of the capacitor voltage curves 56, 58, 60 crosses a plot 62 of the reference voltage threshold at different times 64, 66, 68 respectively. Recognizing that the charging curve for each voltage level will cross the threshold voltage level at a unique time point allows the accurate construction and use of the lookup table. And, moreover, it will be appreciated that knowing the value(s) of the voltage source(s) used in calibration, combined with the knowledge of the value of the fixed reference or threshold voltage, allows calculation of an accurate lookup table unique to each device.

With these principles in mind, it will be appreciated that having a stable, known, threshold voltage is important. With reference to FIG. 2, it will be appreciated that stability of the voltage source 37 powering the comparator 33 is assumed. Nevertheless, as there can be some variation in this voltage. An increase in stabilization, though at a slight increase in cost, can be achieved by including a zener diode in place of the resistor 35 between the threshold voltage input line 36 and ground 15.

Another important feature, as mentioned above, is that the system 10 can convert a low frequency analog signal to a digital signal. Signals having frequencies in the 20–30 Hz range and lower can be analyzed with this device. As will be appreciated, the ability of the device to track a changing signal is limited by the speed of the microcontroller 20 selected, as well as the charging time of the capacitor 16 and resistor 24 combination selected. Therefore, higher frequency voltage signals could be monitored, but at the price of increasing component part costs in all likelihood.

The principles of the invention illustrated by the embodiments described herein is particularly valuable because of the relatively low cost of implementation. This cost is especially low for systems which already include a microcontroller 20 for other purposes. Most electronic devices where the circuit 10 can be particularly beneficial already include microcontrollers. Aside from the microcontroller, the circuit 10 has only a few other elements, only one of which is a relatively more complex element, that being the comparator 33 (or reset controller 22 in FIG. 1). The circuit also advantageously uses only two I/O lines on the microcontroller and the output line 26 does not necessarily need to be dedicated.

It will be understood that the above-described illustrated embodiments and arrangements are only illustrative of possible application(s) of principles of the present invention. Numerous modifications and alternative arrangements can be made by those skilled in the art. The appended claims accordingly are not to be construed as limited to the particular examples discussed herein. Thus, while principles of the present invention have been illustrated with particularity and in detail in connection with what is presently deemed to be the most practical and preferred embodiments of the invention at the time of applying for letters patent, numerous modifications can be made without departing from the spirit and scope of the invention as set forth in the appended claims.

What is claimed is:

1. A voltage measuring circuit configured for measuring a voltage level of an unknown voltage source, comprising:
   (a) a capacitor connected and configured to charge from the unknown voltage source;
   (b) a resistor connected between the unknown voltage source and the capacitor;
   (c) a switch, shunt-coupled to the capacitor, and configured for discharging the capacitor after the capacitor has reached a threshold voltage so as to enable the capacitor to be charged again; and,
   (d) a microcontroller configured to control the switch and measure an amount of time required to charge the capacitor to the threshold voltage through the resistor, the time required to charge the capacitor to the threshold voltage being used to determine the voltage level of the unknown voltage source using at least one stored calibration data value.

2. A voltage measuring circuit as in claim 1, wherein the capacitor for storing a charge from the unknown voltage source can remain connected to the unknown voltage source during and between a plurality of cycles of charging and discharging the capacitor.

3. A voltage measuring circuit as in claim 1, further comprising a lookup table stored in memory of the microcontroller, and in which an amount of time taken to charge the capacitor is indexed to a voltage level of the unknown voltage source.

4. A voltage measuring circuit as in claim 1, further comprising a voltage comparator configured to signal the microcontroller when the threshold voltage has been reached.

5. A voltage measuring circuit as in claim 1, further comprising a reset controller, configured to signal the microprocessor when the threshold voltage has been reached.

6. A voltage measuring circuit as in claim 1, wherein the unknown voltage source is a DC voltage source.

7. A voltage measuring circuit as in claim 6, wherein the unknown voltage source comprises a battery.

8. A voltage measuring circuit as in claim 1, wherein the switch is a transistor.

9. A method for measuring the voltage level of an unknown voltage source, comprising the steps of:

(a) providing a resistor and a capacitor;

(b) charging the capacitor from the unknown voltage source through the resistor to a threshold voltage;

(c) providing a switch shunt-coupled to the capacitor;

(d) measuring a length of time needed to charge the capacitor to the threshold voltage;

(e) determining the voltage level of the unknown voltage source based on the length of time required to charge the capacitor to the threshold voltage using at least one stored calibration data value; and, (f) discharging the capacitor voltage after the capacitor charge has reached a threshold value using the switch without disconnecting the capacitor from the unknown voltage source.

10. A method as in claim 9 wherein the step of determining the voltage level further comprises providing a microcontroller and determining the time required to charge the capacitor using the microcontroller.

11. A method as in claim 10 wherein the step of determining the voltage level further comprises determining the voltage level of the unknown voltage source using an a logarithmic function programmed into the microcontroller using the following formula:

$$V\ V_t/(1-e^{(-t/R_1C_1)})$$

wherein

V is the voltage of the unknown voltage source;

$V_t$ is the voltage of the capacitor at time t;

e is the natural logarithmic number;

t is the measured time taken to charge the capacitor;

$R_1$ is the value of the resistor used; and $C_1$ is the value of the capacitor used.

12. A method as in claim 11, wherein the step of determining the voltage level of the unknown voltage source further comprises indexing into a lookup table of charging time values and corresponding voltage values stored in a microcontroller memory, which allows an unknown source voltage value to be determined corresponding to a length of time measured to charge the capacitor.

13. A method as in claim 9 wherein the step of measuring the length of time needed to charge the capacitor to the threshold voltage further comprises using a voltage comparator to determine when the capacitor has been charged to the threshold voltage value.

14. A method as in claim 13 wherein the step of determining the voltage level of the unknown voltage source is performed using a voltage comparator wherein the threshold voltage is a fraction of a supply voltage for the comparator.

15. A method for measuring the voltage level of an unknown voltage source, comprising the steps of:

(a) providing a resistor and a capacitor;

(b) charging the capacitor from the unknown voltage source through the resistor to a threshold voltage;

(c) providing a switch shunt-coupled to the capacitor;

(d) providing a microcontroller and determining a length of time needed to charge the capacitor to the threshold voltage using the microcontroller;

(e) determining the voltage level of the unknown voltage source based on the length of time required to charge the capacitor to the threshold voltage determining the voltage level of the unknown voltage source using an a logarithmic function programmed into the microcontroller using the following formula:

$$V\ V_t/(1-e^{(-t/R_1C_1)})$$

wherein

V is the voltage of the unknown voltage source;

$V_t$ is the voltage of the capacitor at time t;

e is the natural logarithmic number;

t is the measured time taken to charge the capacitor;

$R_1$ is the value of the resistor used; and $C_1$ is the value of the capacitor used; and, (f) discharging the capacitor voltage after the capacitor charge has reached a threshold value using the switch without disconnecting the capacitor from the unknown voltage source.

16. A method as in claim 15, wherein the step of determining the voltage level of the unknown voltage source further comprises indexing into a lookup table of charging time values and corresponding voltage values stored in a microcontroller memory, which allows an unknown source voltage value to be determined corresponding to a length of time measured to charge the capacitor.

17. A method for measuring the voltage of an unknown voltage source using a microcontroller having a timer, comprising the steps of:

(a) providing a capacitor and resistor, the capacitor connected to the unknown voltage source through the resistor;

(b) charging the capacitor from the unknown voltage source through the resistor;

(c) measuring a length of time needed to charge the capacitor using the timer;

(d) determining the voltage of the unknown voltage source based on the length of time required to charge the capacitor;

(e) discharging the capacitor voltage using a solid-state switching device without disconnecting the capacitor from the unknown voltage source after the microcontroller has determined that the capacitor voltage has reached a threshold value;

(f) providing a transistor switching device;

(g) connecting an output line of the microcontroller to a base of the transistor switching device; and, (h) bringing the output line from low to high after the microcontroller determines the capacitor is charged to the threshold voltage, which causes the transistor to go into saturation and discharges the capacitor.

18. A method as in claim 17, wherein step (b) further comprises the step of bringing the microcontroller output line low when the microcontroller starts the timer, which allows the capacitor to be charged from the unknown voltage source through the resistor.

19. A method for measuring the voltage of an unknown voltage source using a microcontroller having a timer, comprising the steps of:

(a) providing a capacitor and a resistor, the capacitor connected to the unknown voltage source through the resistor;

(b) charging the capacitor from the unknown voltage source through the resistor;

(c) measuring a length of time needed to charge the capacitor using the timer;

(d) determining the voltage of the unknown voltage source based on the length of time required to charge the capacitor using at least one stored calibration data value; and, (e) discharging the capacitor voltage using a solid-state switching device without disconnecting the capacitor from the unknown voltage source after the microcontroller has determined that the capacitor voltage has reached a threshold value.

20. A method as in claim 19, further comprising the step of displaying information about the unknown voltage source based on the voltage determined in step (d).

21. A method as in claim 19, wherein step (c) further comprises the steps of i) initiating charging of the capacitor at the same time as initiating timing of the charging of the capacitor; ii) providing a voltage comparator, and determining that a capacitor voltage has reached a threshold value using the voltage comparator; and, iii) ending timing of the charging of the capacitor when the threshold voltage has been reached.

22. A method as in claim 21, further comprising the step of connecting the comparator so that a reference voltage comprising the threshold voltage is a fraction of the power supply voltage of the comparator.

23. A method as in claim 19, wherein step (e) further comprises the steps of i) providing a transistor switching device; ii) connecting an output line of the microcontroller to a base of the transistor switching device; iii) bringing the output line from low to high after the microcontroller determines the capacitor is charged to the threshold voltage, which causes the transistor to go into saturation and discharges the capacitor.

24. A method as in claim 23, wherein step (b) further comprises the step of bringing the microcontroller output line low when the microcontroller starts the timer, which allows the capacitor to be charged from the unknown voltage source through the resistor.

25. A method as in claim 19, further comprising the step of displaying information about the unknown voltage source based on the voltage determined in step (d).

26. A method as in claim 19 wherein the step of determining the voltage level further comprises determining the voltage level of the unknown voltage source using an a logarithmic function programmed into the microcontroller using the following formula:

$$V = V_t/(1-e^{(-t/R_1 C_1)})$$

wherein

V is the voltage of the unknown voltage source;

$V_t$ is the voltage of the capacitor at time t;

e is the natural logarithmic number;

t is the measured time taken to charge the capacitor;

$R_1$ is the value of the resistor used; and $C_1$ is the value of the capacitor used.

27. A method as in claim 26, wherein the step of determining the voltage level of the unknown voltage source further comprises indexing into a lookup table of charging time values and corresponding voltage values stored in a microcontroller memory, which allows an unknown source voltage value to be determined corresponding to a length of time measured to charge the capacitor.

* * * * *